US00RE50487E

(19) United States
(12) Reissued Patent
Park et al.

(10) Patent Number: US RE50,487 E
(45) Date of Reissued Patent: *Jul. 8, 2025

(54) DISPLAY DEVICE AND MANUFACTURING METHOD THEREOF

(71) Applicant: Samsung Display Co., Ltd., Yongin-si (KR)

(72) Inventors: Byoung-Hee Park, Yongin-si (KR); Joo-Hyeon Lee, Yongin-si (KR); Jin-Koo Chung, Yongin-si (KR)

(73) Assignee: Samsung Display Co., Ltd., Yongin-si (KR)

( * ) Notice: This patent is subject to a terminal disclaimer.

(21) Appl. No.: 18/649,415

(22) Filed: Apr. 29, 2024

Related U.S. Patent Documents

Reissue of:
(64) Patent No.: 9,847,486
Issued: Dec. 19, 2017
Appl. No.: 15/343,315
Filed: Nov. 4, 2016

U.S. Applications:
(60) Continuation of application No. 16/719,751, filed on Dec. 18, 2019, now Pat. No. Re. 49,965, which is an
(Continued)

(30) Foreign Application Priority Data

Mar. 10, 2010 (KR) ..... 10-2010-0021384

(51) Int. Cl.
*H01L 21/00* (2006.01)
*H01L 27/32* (2006.01)
(Continued)

(52) U.S. Cl.
CPC ..... *H10K 71/621* (2023.02); *H10K 50/82* (2023.02); *H10K 50/826* (2023.02);
(Continued)

(58) Field of Classification Search
CPC ..... H10K 59/35; H10K 50/82; H10K 71/621; H10K 59/121; H10K 50/826;
(Continued)

(56) References Cited

U.S. PATENT DOCUMENTS 4,720,835 A 1/1988 Akiba et al.
2004/0195963 A1 10/2004 Choi et al.
(Continued)

FOREIGN PATENT DOCUMENTS

CN 1802051 A 7/2006
CN 1938854 A 3/2007
(Continued)

OTHER PUBLICATIONS

Tung, et al., A 200-dpi Transparent a-Si TFT Active-Matrix Phosphorescent OLED Display, SID 05 Digest 49.3, pp. 1546-1549.
(Continued)

*Primary Examiner* — Ling X Xu
(74) *Attorney, Agent, or Firm* — Womble Bond Dickinson (US) LLP

(57) ABSTRACT

An organic light emitting display device having high transmittance with respect to external light and a method of manufacturing the same. The organic light emitting display device includes a substrate; a plurality of pixels formed on the substrate, each of the pixels including a first region that emits light and a second region that transmits external light; a plurality of thin film transistors disposed in the first region of each pixel; a plurality of first electrodes disposed in the first region of each pixel and electrically connected to the thin film transistors, respectively; a second electrode formed opposite to the plurality of first electrodes and comprising a plurality of transmission windows corresponding to the second regions; and an organic layer formed between the first electrodes and the second electrode. The transmission
(Continued)

windows can be formed in the second electrode, that is, a cathode.

19 Claims, 10 Drawing Sheets

Related U.S. Application Data application for the reissue of Pat. No. 9,847,486, which is a division of application No. 13/038,836, filed on Mar. 2, 2011, now Pat. No. 9,490,311.

(51) Int. Cl.

| | |
|---|---|
| ***H01L 29/786*** | (2006.01) |
| ***H01L 51/00*** | (2006.01) |
| ***H01L 51/52*** | (2006.01) |
| ***H10K 50/82*** | (2023.01) |
| ***H10K 50/826*** | (2023.01) |
| ***H10K 59/121*** | (2023.01) |
| ***H10K 59/126*** | (2023.01) |
| ***H10K 59/35*** | (2023.01) |
| ***H10K 71/00*** | (2023.01) |
| *H10D 30/67* | (2025.01) |
| *H10K 50/828* | (2023.01) |
| *H10K 59/12* | (2023.01) |
| *H10K 102/00* | (2023.01) |

(52) U.S. Cl.
CPC ..... *H10K 59/121* (2023.02); *H10K 59/126* (2023.02); *H10K 59/35* (2023.02); *H10D 30/6755* (2025.01); *H10K 50/828* (2023.02); *H10K 59/1201* (2023.02); *H10K 2102/3031* (2023.02)

(58) Field of Classification Search
CPC ..... H10K 59/126; H10K 59/1201; H10K 2102/3031; H01L 29/7869
See application file for complete search history.

(56) References Cited

U.S. PATENT DOCUMENTS

| | | | | |
|---|---|---|---|---|
| 2006/0097251 | A1 | 5/2006 | Kang | |
| 2007/0146592 | A1 | 6/2007 | Kimura | |
| 2007/0194702 | A1 | 8/2007 | Jeng et al. | |
| 2007/0291325 | A1 | 12/2007 | Toyota et al. | |
| 2008/0224599 | A1 | 9/2008 | Kim | |
| 2008/0278063 | A1 | 11/2008 | Cok | |
| 2010/0044692 | A1* | 2/2010 | Kim | H01L 51/5281 257/40 |

FOREIGN PATENT DOCUMENTS

| | | | |
|---|---|---|---|
| EP | 1770672 | A1 | 4/2007 |
| JP | 2002-231449 | A | 8/2002 |
| JP | 2003-066868 | A | 3/2003 |
| JP | 2004-311440 | A | 11/2004 |
| JP | 2006-128241 | A | 5/2006 |
| JP | 2007-103028 | A | 4/2007 |
| JP | 2007-114257 | A | 5/2007 |
| JP | 2008-112112 | | 5/2008 |
| KR | 10 2003-0027168 | A | 4/2003 |
| KR | 10-0810641 | B1 | 2/2008 |
| TW | 200732733 | A | 9/2007 |

OTHER PUBLICATIONS

Korean Office Action in KR 10 2010-0021384, dated Jun. 29, 2011 (Park, et al.).

Japanese Office Action dated Apr. 1, 2014.

Extended European Search Report dated Apr. 15, 2014.

Chinese Office Action dated Sep. 28, 2014.

Chinese Granted Document dated Mar. 23, 2016 for Corresponding Chinese Patent Application No. 201110059255.1.

* cited by examiner

DISPLAY DEVICE AND MANUFACTURING METHOD THEREOF

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This *application is a continuation reissue application of U.S. patent application Ser. No. 16/719,751, filed on Dec. 18, 2019, which is an application for reissue of U.S. Pat. No. 9,847,486, issued Dec. 19, 2017, which* is a divisional application based on [pending] application Ser. No. 13/038,836, filed Mar. 2, 2011, [the entire contents of which is hereby incorporated by reference. The application] (*now U.S. Pat. No. 9,490,311*), *and which* claims *priority to and* the benefit of Korean Patent Application No. 10-2010-0021384, filed on Mar. 10, 2010, in the Korean Intellectual Property Office, the [disclosure] *entire content of both* of which is incorporated herein by reference.

BACKGROUND

1. Field

An aspect of the present invention relates to an organic light emitting display device, and more particularly, to a transparent organic light emitting display device and a method of manufacturing the same.

2. Description of the Related Art

As organic light emitting display devices have superior characteristics such as wide viewing angle, high contrast ratio, short response time, and low power consumption, they are widely used in personal portable devices such as MP3 players, mobile phones, television sets, etc.

Also, transparent organic light emitting display devices have been constructed using transparent thin film transistors and transparent organic light emitting devices.

However, since a cathode of the transparent organic light emitting display device is formed of a metal, there is a limit in increasing the transmittance of the transparent organic light emitting display device.

SUMMARY

An aspect of the present invention provides a transparent organic light emitting display device having high transmittance with respect to external light and a method of manufacturing the transparent organic light emitting display device.

According to another aspect of the present invention, there is also provided an organic light emitting display device including a cathode having transmission windows and that are formed in a simple way, and a method of manufacturing the organic light emitting display device.

According to an aspect of the present invention, there is provided an organic light emitting display device including a substrate; a plurality of pixels formed on the substrate, each of the pixels having a first region that emits light and a second region that transmits external light; a plurality of thin film transistors disposed in the first region of the pixel; a plurality of first electrodes disposed in the first region of the pixel and electrically connected to the thin film transistors, respectively; a second electrode formed opposite to the plurality of first electrodes and comprising a plurality of transmission windows corresponding to the second regions; and an organic layer formed between the first electrodes and the second electrode.

According to an aspect of the present invention, a decrease in the transmittance of the second region where external light is transmitted may be prevented as much as possible. Thus, a user may easily observe external images.

According to another aspect of the present invention, the transmission windows may be formed in the second electrode by using a simple method.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
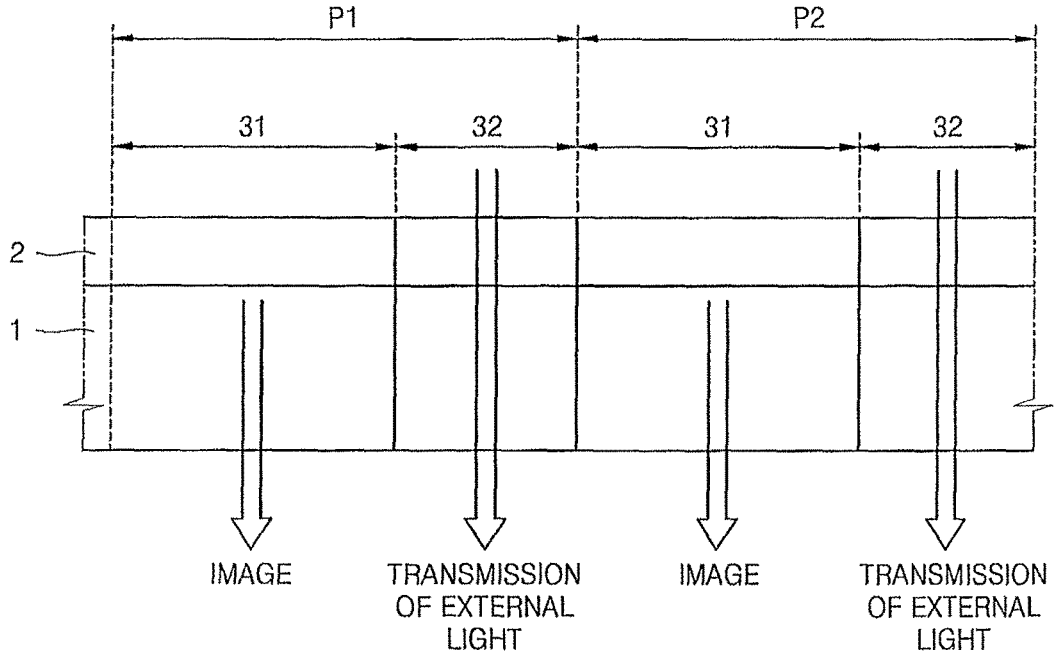
FIG. 1 is a schematic cross-sectional view of an organic light emitting display device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Here, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on"

or "disposed on" and is not meant to be limiting regarding any particular fabrication process.

FIG. 1 is a schematic cross-sectional view of an organic light emitting display device according to an embodiment of the present invention. Referring to FIG. 1, the organic light emitting display device according to an embodiment of the present invention includes a substrate 1 and a display unit 2 placed on the substrate 1. External light enters the organic light emitting display device via the display unit 2 and the substrate 1.

As will be described later, the display unit 2 transmits external light. Referring to FIG. 1, the display unit 2 allows a user positioned below the substrate 1 to view external images beyond the display unit 2. Although a bottom-emission type organic light emitting display device in which images on the display unit 2 are displayed toward the substrate 1 as illustrated in FIG. 1, aspects of the present invention are not limited thereto, and may be equally applied to a top-emission type organic light emitting display device in which images on the display unit 2 are displayed in a direction opposite to the substrate 1.

FIG. 1 illustrates two adjacent pixels, namely, a first pixel P1 and a second pixel P2, of the organic light emitting display device according to an aspect of the present invention.

Each of the first and second pixels P1 and P2 includes a first region 31 and a second region 32.

An image is displayed on the display unit 2 in the first region 31, and external light passes through the display unit 2 in the second region 32.

In other words, since each of the first and second pixels P1 and P2 includes the first region 31 where images are displayed and the second region 32 which transmits external light, a user can see an external image through the second region 32 when the user does not see the image displayed through the first region 31.

Thus, the second region 32 does not include devices such as a thin film transistor, a capacitor, and an organic light emitting device, and thus external light transmittance may be maximized and distortion of a transmitted image due to interference of the devices such as a thin film transistor, a capacitor, and an organic light emitting device may be prevented as much as possible.

Figure 2:
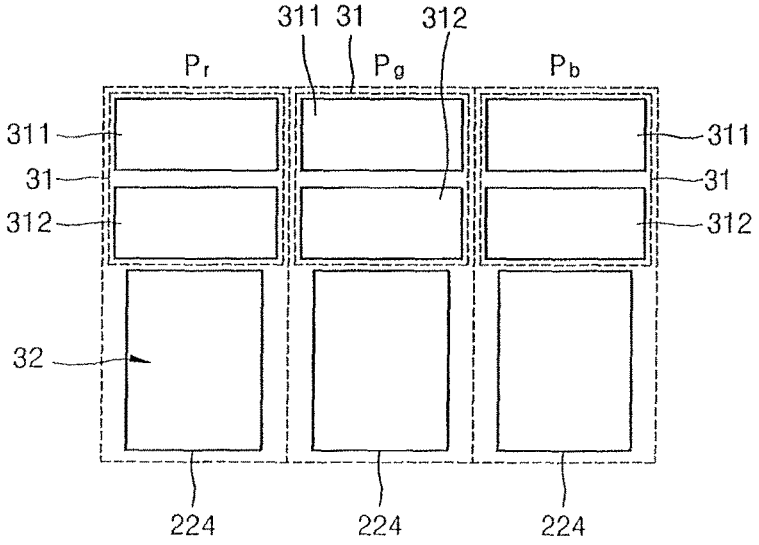
FIG. 2 is a schematic plan view of an organic light emitting display device according to an embodiment of the present invention.

FIG. 2 is a schematic plan view of a red pixel $P_r$, a green pixel $P_g$, and a blue pixel $P_b$ that are adjacent to one another.

Each of the red, green, and blue pixels $P_r$, $P_g$, and $P_b$ includes a circuit region 311 and an emission region 312 in the first region 31. The circuit region 311 and the emission region 312 are adjacent to each other.

The second region 32 that transmits external light is adjacent to the first region 31.

Figure 3:
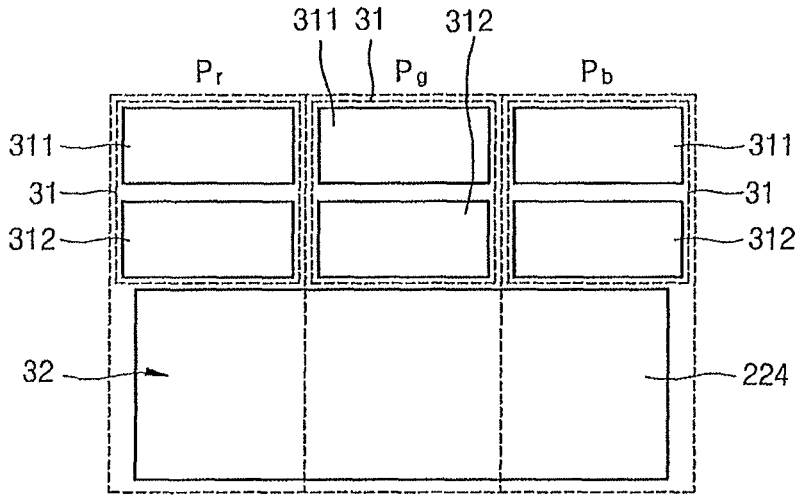
FIG. 3 is a schematic plan view of an organic light emitting display device according to another embodiment of the present invention.

As illustrated in FIG. 2, independent second regions 32 may be included in the red, green, and blue pixels $P_r$, $P_g$, and $P_b$, respectively. Alternatively, as illustrated in FIG. 3, second regions 32 may be connected to one another across the red, green, and blue pixels $P_r$, $P_g$, and $P_b$. In the embodiment of FIG. 3, an area of the second region 32 through which external light passes is increased, and thus the transmittance of the entire display unit 2 may be increased.

Although the second regions 32 of the red, green, and blue pixels $P_r$, $P_g$, and $P_b$ are integrally connected to one another in FIG. 3, the aspects of the present invention are not limited thereto, and the second regions of only two adjacent pixels from among the red, green, and blue pixels $P_r$, $P_g$, and $P_b$ may be connected to each other.

Figure 4:
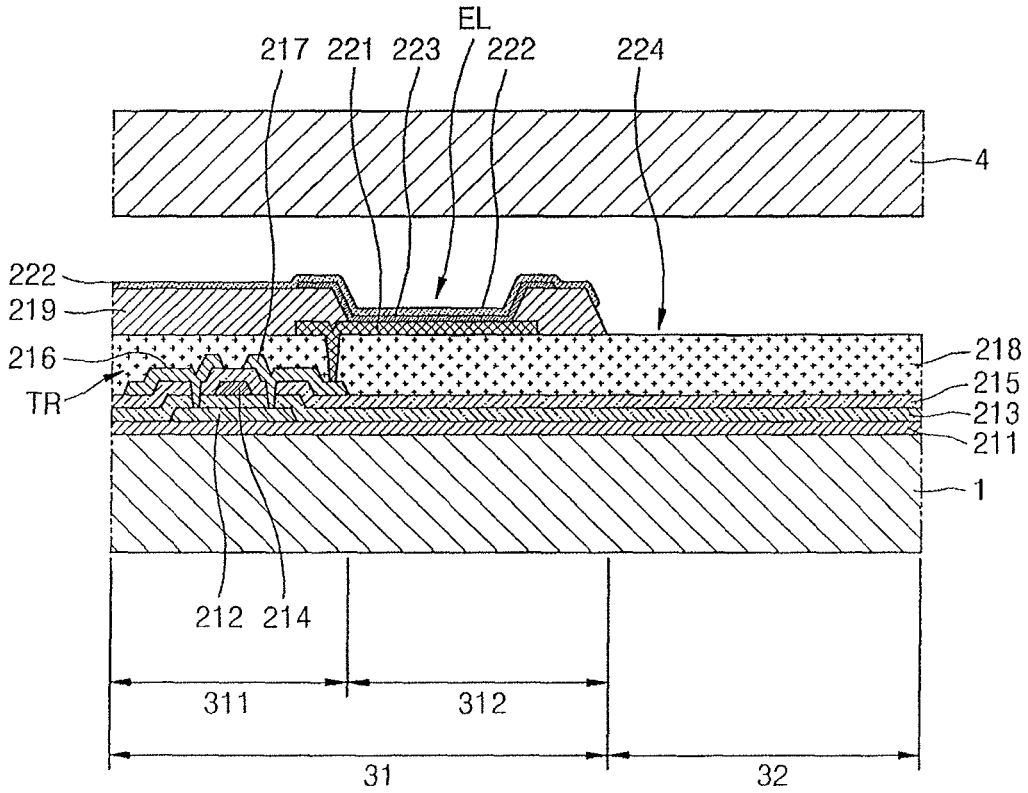
FIG. 4 is a cross-sectional view of a pixel of an organic light emitting display device according to an embodiment of the present invention.

FIG. 4 illustrates a cross-section of the red, green, or blue pixel Pr, Pg, or Pb illustrated in FIGS. 2 and 3.

As illustrated in FIG. 4, a thin film transistor TR is arranged in the circuit region 311. However, a pixel circuit including the thin film transistor TR may be also included in the circuit region 311. Alternatively, the circuit region 311 may further include a plurality of thin film transistors TR and a storage capacitor. In this case, wires such as scan lines, data lines, and Vdd lines connected to the thin film transistors TR and the storage capacitor may be further included in the circuit region 311.

An organic light emitting diode EL may be disposed in the emission region 312. The organic light emitting diode EL is electrically connected to the thin film transistor TR of the circuit region 311.

A buffer layer 211 is formed on the substrate 1, and a pixel circuit including the thin film transistor TR is formed on the buffer layer 211.

First, a semiconductor active layer 212 is formed on the buffer layer 211.

The buffer layer 211 is formed of a transparent insulation material and prevents impurity elements from penetrating into the substrate 1 and planarizes a surface of the substrate 1. The buffer layer 211 may be formed of any of various materials that can perform the functions described above. For example, the buffer layer 211 may be formed of an inorganic material such as silicon oxide, silicon nitride, silicon oxynitride, aluminum oxide, aluminum nitride, titanium oxide, or titanium nitride, an organic material such as polyimide, polyester, or acryl, or stacks of these materials. The buffer layer 211 is not an essential element and may not be formed at all.

The semiconductor active layer 212 may be formed of polycrystal silicon, but is not limited thereto and may be formed of a semiconductor oxide. For example, the semiconductor active layer 212 may be a G-I-Z—O layer [$a(In_2O_3)b(Ga_2O_3)c(ZnO)$ layer] (where a, b, and c are natural numbers that respectively satisfy $a \geq 0$, $b \geq 0$, and $c \geq 0$). When the semiconductor active layer 212 is formed of a semiconductor oxide, light transmittance in the circuit region 311 of the first region 31 may be increased, and thus external light transmittance of the entire display unit 2 may be increased.

A gate insulating layer 213 is formed on the buffer layer 211 so as to cover the semiconductor active layer 212, and a gate electrode 214 is formed on the gate insulating layer 213.

An interlayer insulating layer 215 is formed on the gate insulating layer 213 so as to cover the gate electrode 214. A source electrode 216 and a drain electrode 217 are formed on the interlayer insulating layer 215 so as to contact the semiconductor active layer 212 via contact holes.

The structure of the thin film transistor TR is not limited to the above-described structure, and the thin film transistor TR may have various other structures.

A passivation layer 218 is formed to cover the thin film transistor TR. The passivation layer 218 may be a single-layered or multi-layered insulating layer, an upper surface of which is planarized. The passivation layer 218 may be formed of an inorganic material and/or an organic material.

As illustrated in FIG. 4, a first electrode 221 of an organic light emitting diode EL electrically connected to the thin film transistor TR is formed on the passivation layer 218. The first electrode 221 corresponds to each pixel.

An insulating layer 219 is formed of an organic and/or inorganic insulating material on the passivation layer 218 to cover at least an edge portion of the first electrode 221.

The insulating layer 219 exposes only a central portion of the first electrode 221. Although the insulating layer 219 may be included to cover the first region 31, the first insulating layer 219 does not necessarily cover the entire first region 31, and it is sufficient for the insulating layer 219 to cover only a part of the first region 31, particularly, an edge of the first electrode 221.

An organic layer 223 and a second electrode 222 are sequentially stacked on the first electrode 221. The second electrode 222 covers the organic layer 223 and the insulating layer 219, and second electrodes 222 corresponding to all of the pixels are electrically connected to one another.

The organic layer 223 may be a low molecular weight organic layer or a polymer organic layer. When the organic layer 223 is a low molecular weight organic layer, the organic layer 223 may be formed by stacking a hole injection layer (HIL), a hole transport layer (HTL), an emission layer (EML), an electron transport layer (ETL), and an electron injection layer (EIL) in a single structure or a composite structure, and may be formed of any of various materials such as copper phthalocyanine (CuPc), N,N'-Di (naphthalene-1-yl)-N,N'-diphenyl-benzidine (NPB), or tris-8-hydroxyquinoline aluminum (Alq3). The low-molecular weight organic layer may be formed by vacuum deposition. Herein, the HIL, the HTL, the ETL, and the EIL are common layers and may be commonly applied to red, green, and blue pixels.

The first electrode 221 may function as an anode, and the second electrode 222 may function as a cathode. Alternatively, the first electrode 221 may function as a cathode, and the second electrode 222 may function as an anode.

According to an embodiment of the present invention, the first electrode 221 may be a transparent electrode, and the second electrode 222 may be a reflection electrode. The first electrode 221 may include ITO, IZO, ZnO, $In_2O_3$, or the like each having a high work function. The second electrode 222 may be formed of a metal having a low work function, such as Ag, Mg, Al, Pt, Pd, Au, Ni, Nd, Ir, Cr, Li, or Ca. Accordingly, the organic light emitting diode EL is a bottom emission type in which light is emitted towards the first electrode 221.

However, the aspects of the present invention are not limited thereto, and the second electrode 222 may also be a transparent type electrode.

The passivation layer 218, the gate insulating layer 213, the interlayer insulating layer 215, and the insulating layer 219 may be transparent insulating layers.

A sealing substrate 4 may be installed over the second electrode 222. The sealing substrate 4 is located outside the display unit 2 and bonded with the substrate 1 by a sealant (not shown) so as to protect the second electrode 222 from external air. A filler (not shown) may be filled between the sealing substrate 4 and the second electrode 222, and a moisture absorbent may also be interposed therebetween. A sealing structure for the display unit 2 is not limited to the use of the sealing substrate 4, and a film-shaped sealing structure may be used.

Transmission windows 224 are further formed in the second electrode 222 and the insulating layer 219. The transmission windows 224 may be formed only in the second electrode 222, or may be formed in at least one selected from the group consisting of the passivation layer 218, the interlayer insulating layer 215, the gate insulating layer 213, and the buffer layer 211.

The transmission windows 224 are formed at locations corresponding to the second regions 32. The transmission windows 224 may be formed in any pattern such as the one shown in FIGS. 2 and 3. However, it is understood that the transmission windows can have a different pattern than those illustrated in FIGS. 2 and 3.

However, it is difficult to form the transmission windows 224 in the second electrode 222, because a metal for the second electrode 222 should be deposited using a mask having a shield portion corresponding to the pattern of the transmission windows 224 in order to form the transmission windows 224 in the pattern and manufacturing the mask having the shield portion corresponding to the pattern is very difficult.

Figure 5:
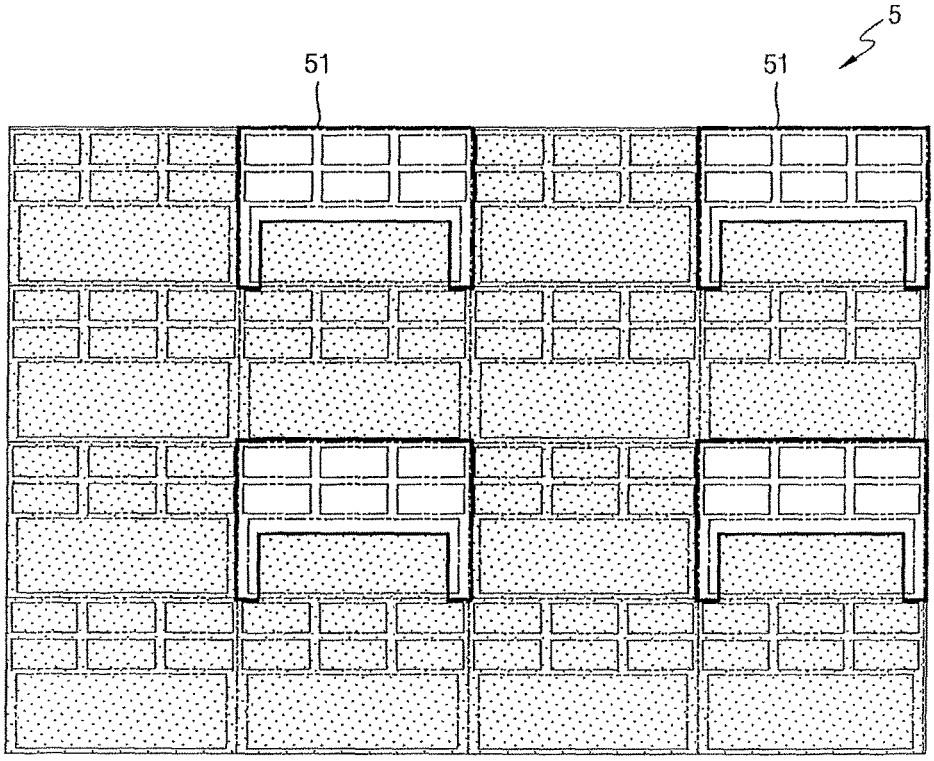
FIG. 5 is a plan view of a mask for forming a second electrode having a transmission window, according to an embodiment of the present invention.

A mask 5 illustrated in FIG. 5 is used to form the second electrode 222 having the transmission windows 224 arranged in such pattern.

The mask 5 has an aperture 51 corresponding to a first region 31 of a specific pixel. A pattern of the apertures 51 shown in FIG. 5 is used to form the transmission windows 224 having the pattern illustrated in FIG. 3. The mask 5 has an aperture 51 corresponding to the first regions 31 of three adjacent pixels, namely, a red pixel, a green pixel, and a blue pixel. The size of the aperture 51 is generally slightly greater than the overall size of the three pixels so that patterns obtained when a material used to form the second electrode 222 is deposited via the apertures 51 overlap each other. Thus, the second electrode 222 may act as a common electrode.

When the three pixels constitute a unit pixel, the apertures 51 are separated from one another by a distance corresponding to the unit pixel in a horizontal direction and a vertical direction.

Figure 6A:
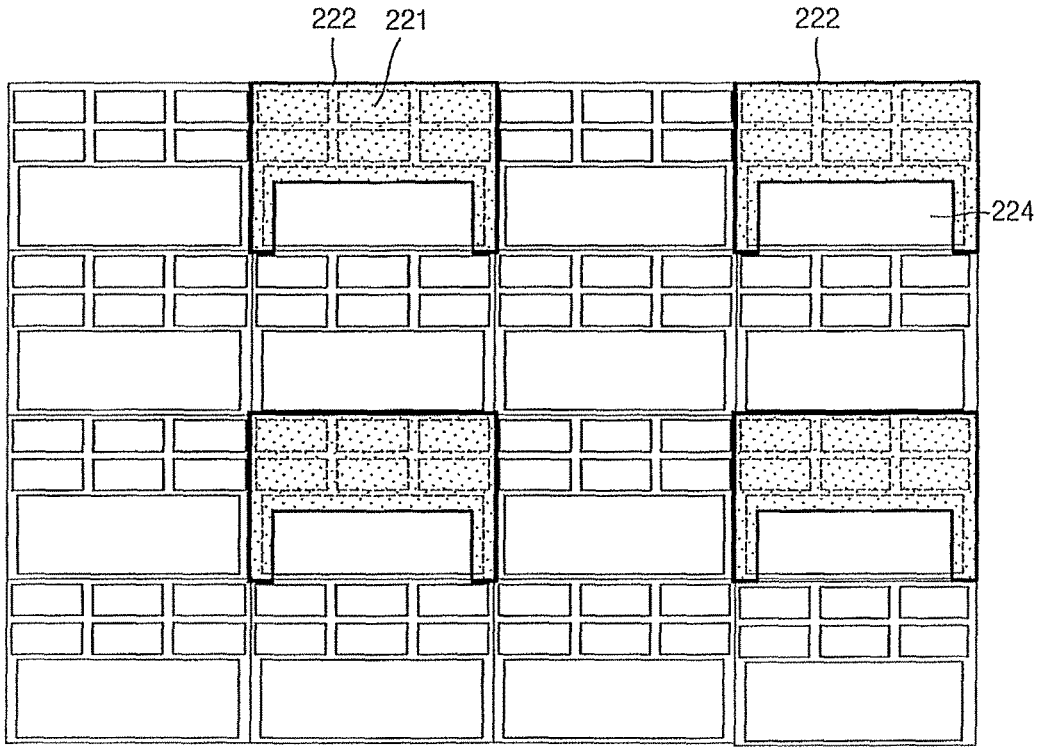
FIGS. 6A through 6D are plan views illustrating an operation of forming a second electrode by using the mask illustrated in FIG. 5.

When a metal used to form the second electrode 222 is deposited on the organic layer 223 by using the mask 5, a pattern illustrated in FIG. 6A is obtained.

Figure 6B:
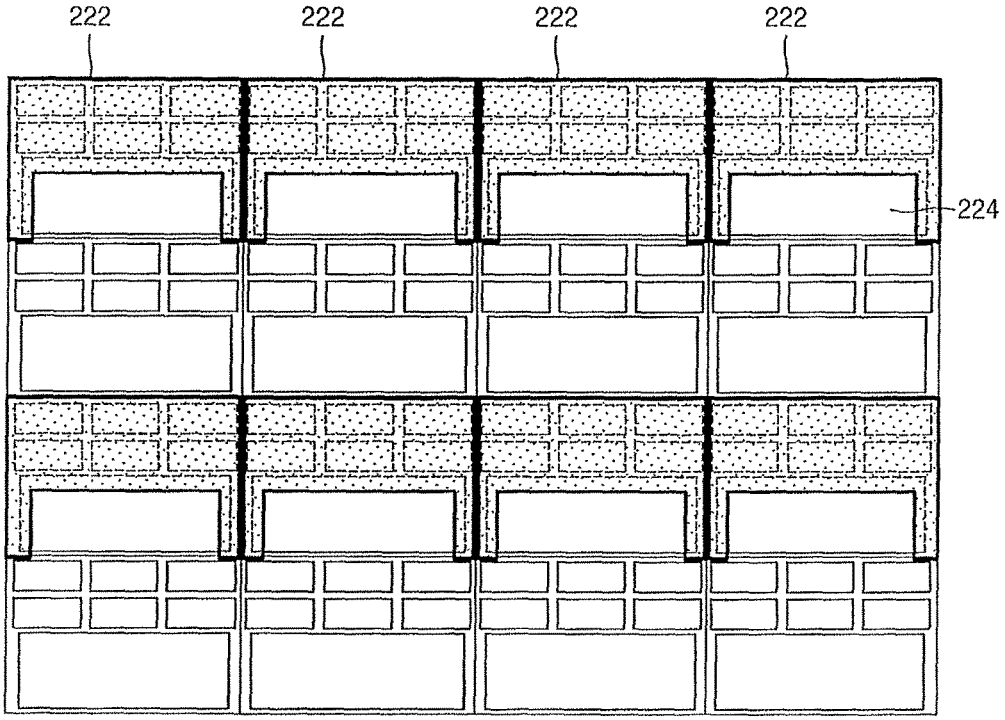
Figure 6C:
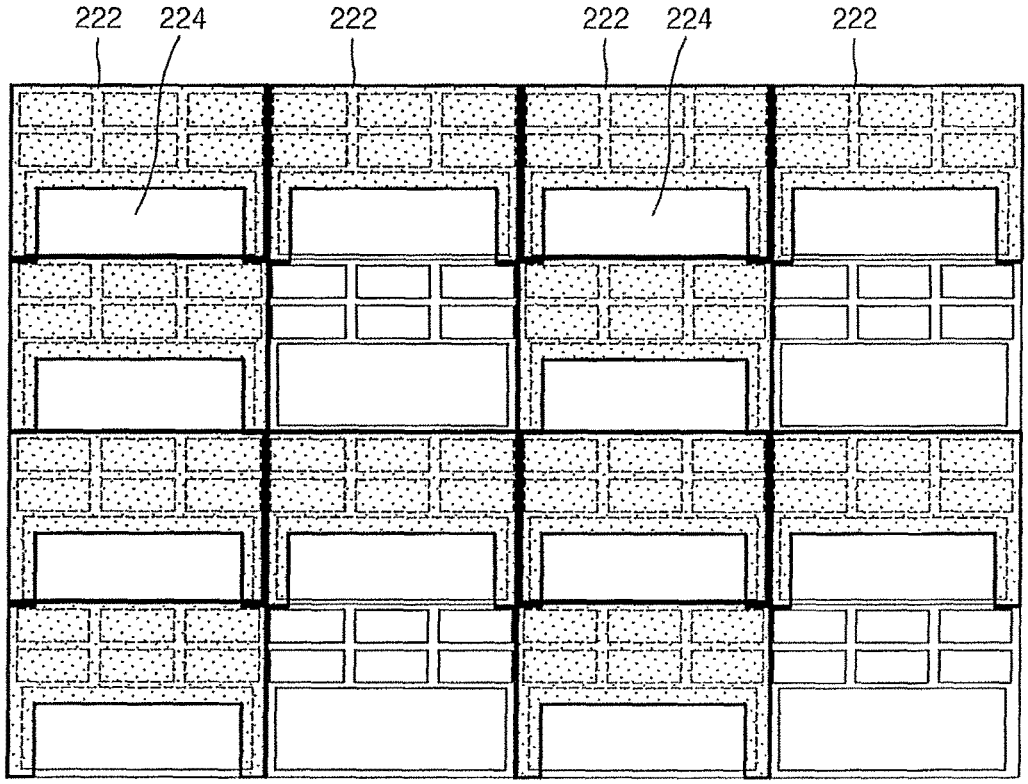
Figure 6D:
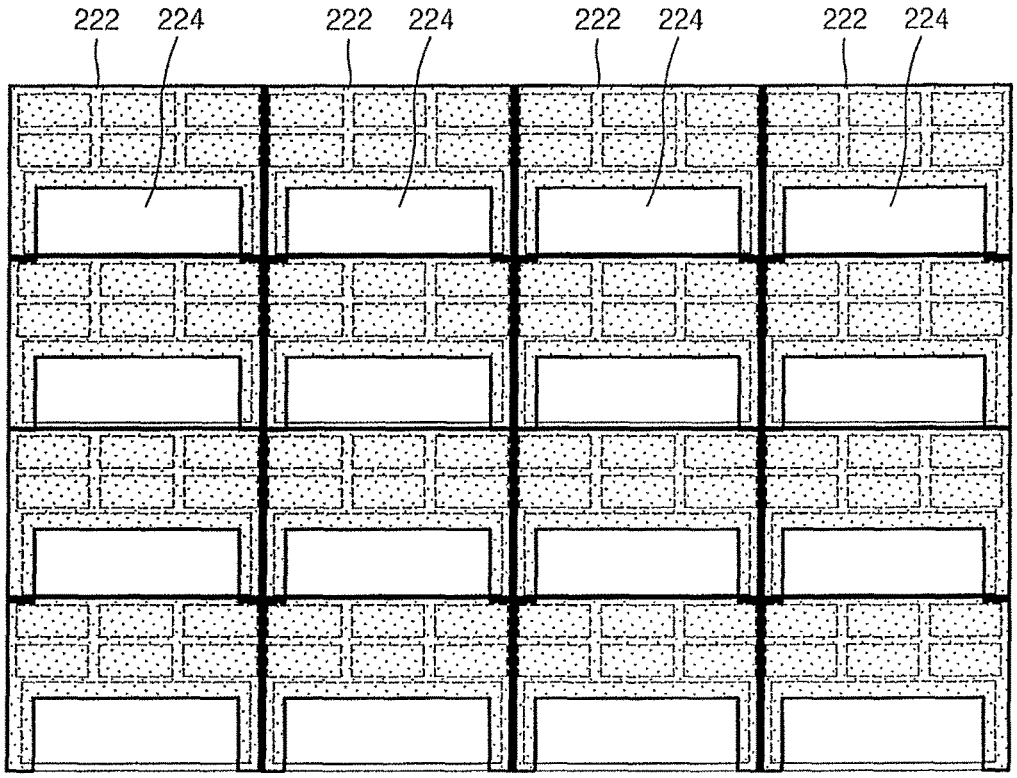

When the mask 5 is shifted by one unit pixel horizontally and then metal is deposited, a pattern as illustrated in FIG. 6B is obtained. When the mask 5 is shifted again by one unit pixel downward and then metal is deposited, a pattern as illustrated in FIG. 6C is obtained. Thereafter, when the mask 5 is shifted again by one unit pixel horizontally and then metal is deposited, a pattern as illustrated in FIG. 6D is obtained. Thus, as illustrated in FIG. 6D, the second electrode 222 having the transmission windows 224 in the pattern of FIG. 3 is obtained.

The pattern of the apertures 51 of the mask 5 is not limited to the pattern illustrated in FIG. 5. In other words, if an aperture 51 is formed at the center of the four adjacent apertures 51 illustrated in FIG. 5 and the aperture 51 at the center is the same as each of the four adjacent apertures 51, the second electrode 222 having the pattern illustrated in FIG. 6D may be obtained by shifting the mask 5 horizontally only once.

Figure 7:
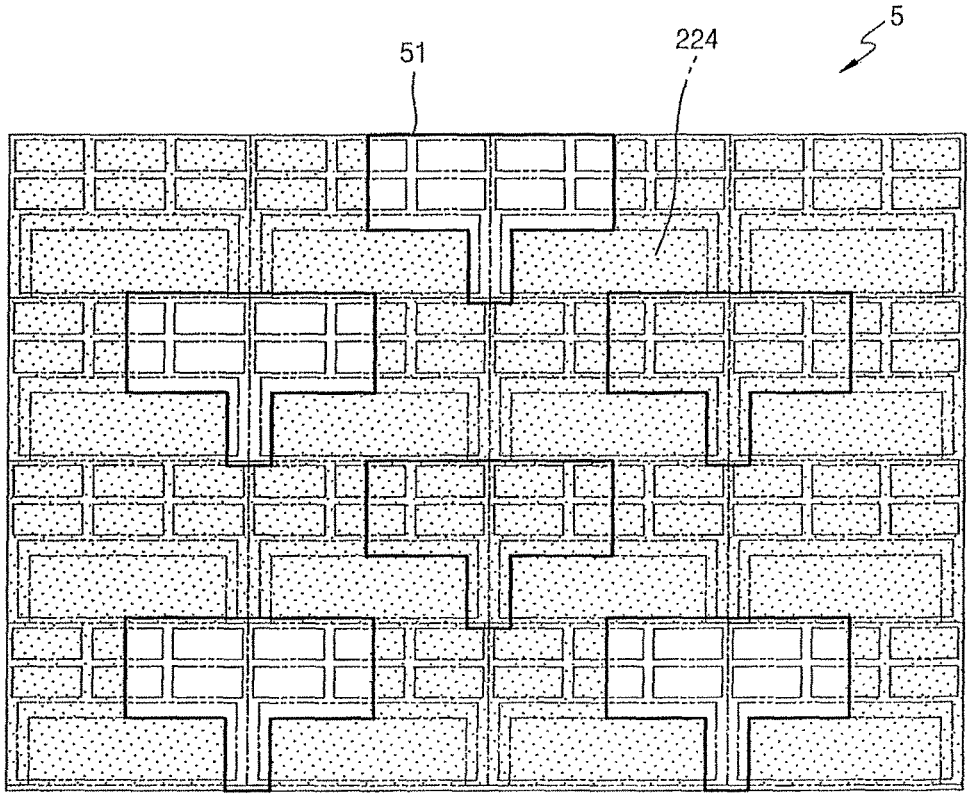
FIG. 7 is a plan view of a mask for forming a second electrode having a transmission window, according to an embodiment of the present invention.
Figure 8:
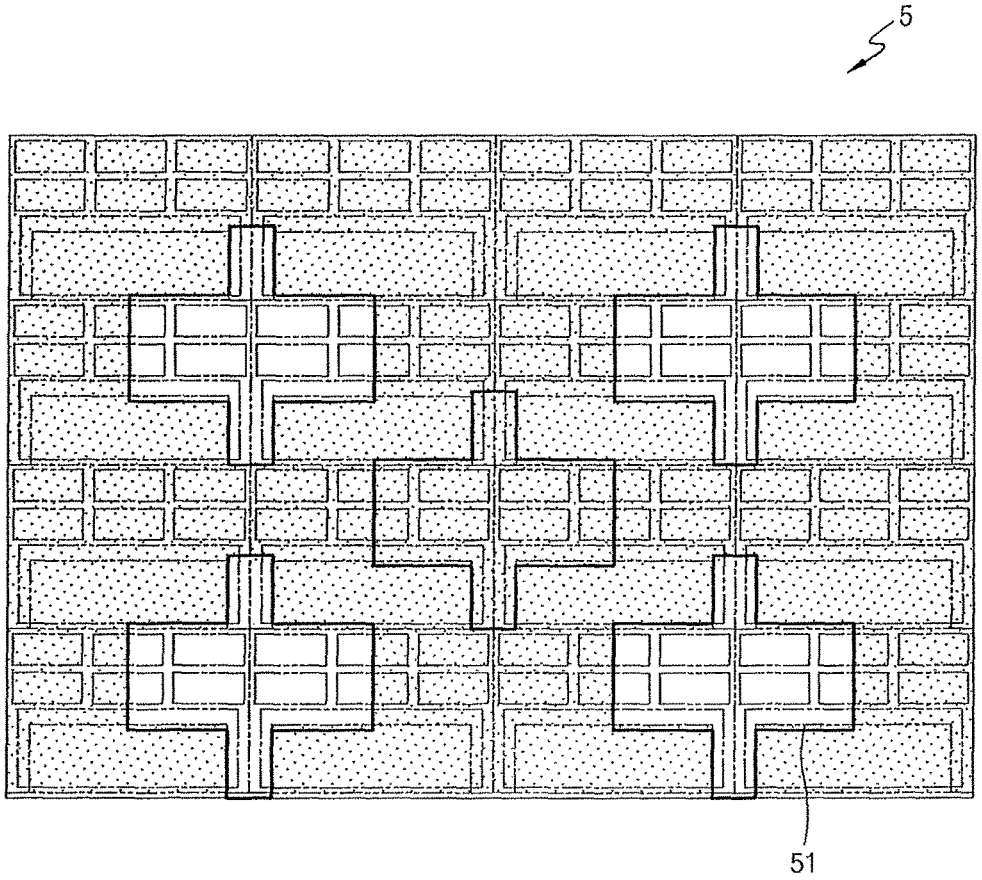
FIG. 8 is a plan view of a mask for forming a second electrode having a transmission window, according to another embodiment of the present invention.

FIGS. 7 and 8 illustrate masks 5 having other shapes than the mask 5 of FIG. 5.

An aperture 51 corresponding to a first region 31 corresponding to three pixels is formed around a region corresponding to a transmission window 224. The pattern of the apertures 51 illustrated in FIG. 7 may allow the second electrode 222 having the pattern illustrated in FIG. 6D to be obtained by shifting the mask 5 horizontally only once. In this case, since an interval between apertures 51 is sufficient, the mask 5 is not destroyed by a tensile force but may be stable.

FIG. 8 illustrates a modified example of FIG. 7. A center of an aperture 51 protrudes upward and downward, and thus when a mask 5 of FIG. 7 is shifted horizontally by one unit pixel and deposition is performed, deposition occurs redundantly on the upward and downward protrusions of the aperture 51. Thus, the second electrode 222 may be stably formed through the entire display unit without any discontinuity.

Figure 9:
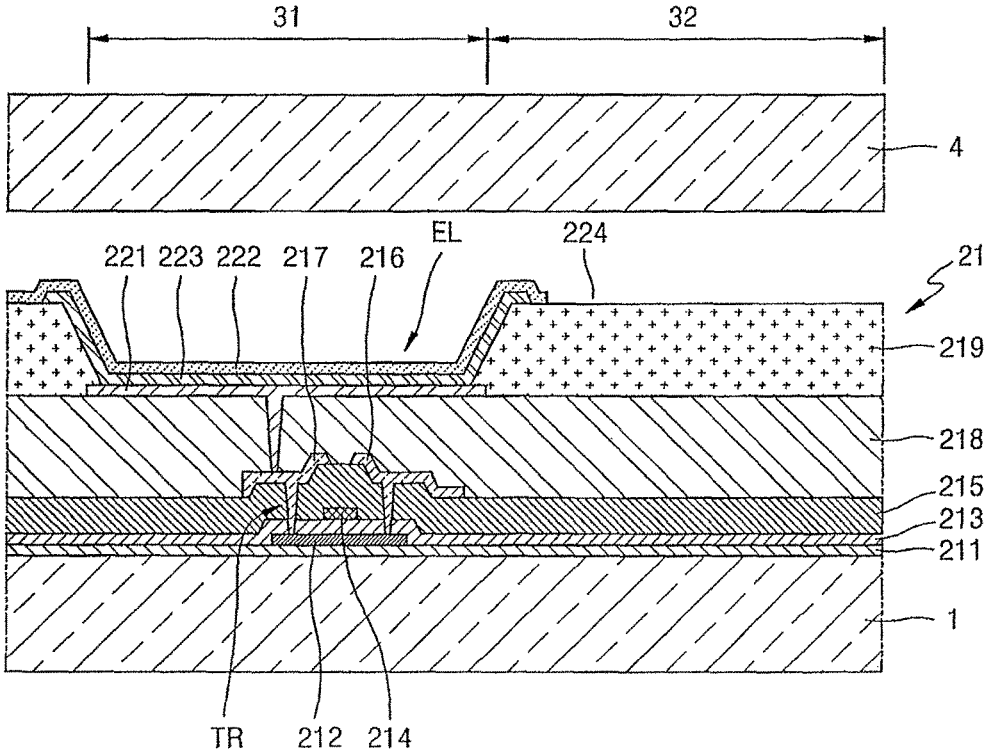
FIG. 9 is a cross-sectional view of a pixel of an organic light emitting display device according to another embodiment of the present invention.

The above embodiment applies not only to a structure in which a circuit part including the thin film transistor TR is not overlapped by the first electrode 221 as illustrated in FIG. 4 but also to a structure in which a circuit part including the thin film transistor TR is overlapped by the first electrode 221 as illustrated in FIG. 9.

In the case of the structure illustrated in FIG. 9, when the first electrode 221 is formed as a reflection electrode, an effect where a conductive pattern of a circuit part is shielded by the first electrode 221 may be obtained. Thus, distortion of a penetrated image due to external light scattered by the conductive pattern of the circuit part may be suppressed.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

[1. A method of manufacturing an organic light emitting display device, the method comprising:

defining a plurality of pixels on a substrate, each of the pixels comprising a first region that emits light and a second region that transmits external light;

forming a plurality of thin film transistors in the first region of each pixel;

forming a plurality of first electrodes electrically connected to the plurality of thin film transistors, respectively, in the first region of each pixel;

forming an organic layer on the plurality of first electrodes; and forming a second electrode on the organic layer in the first region by using a mask having a pattern of apertures corresponding to the first region, such that the formed second electrode defines a plurality of transmission windows that each correspond to the second region, and such that the formed second electrode is absent from the second region.]

[2. The method of claim 1, wherein the apertures are separated from each other at regular intervals.]

[3. The method of claim 2, wherein the apertures are separated from each other at intervals smaller than or equal to a distance corresponding to at least one pixel.]

*4. A method of manufacturing an organic light emitting display device, the method comprising:*

*forming a first pixel including a first electrode and a first organic layer on the first electrode;*

*forming a second pixel including a second electrode and a second organic layer on the second electrode; and*

*forming an opposite electrode on the first organic layer and the second organic layer;*

*wherein at least a portion of the opposite electrode that overlaps the first electrode of the first pixel is connected to at least a portion of the opposite electrode that overlaps the second electrode of the second pixel, and the opposite electrode includes an opening located between the first electrode and the second electrode.*

*5. The method of claim 4, wherein the opening is a rectangle shape.*

*6. The method of claim 4, further comprising:*

*forming a plurality of thin film transistors electrically connected to each of the first electrode and the second electrode.*

*7. The method of claim 4,*

*wherein the first pixel and the second pixel on a substrate, each of the pixels comprising a first region that emits light and a second region that transmits external light.*

*8. The method of claim 7,*

*wherein the opposite electrode by using a mask having a pattern of apertures corresponding to the first region, such that the formed opposite electrode defines the opening that each correspond to the second region, and such that the formed opposite electrode is absent from the second region.*

*9. The method of claim 7,*

*wherein the light transmittance of the second region is higher than the light transmittance of the first region.*

*10. The method of claim 4,*

*wherein a width of the opening in a first direction perpendicular to a second direction is greater than a width of an emission region of the first pixel.*

*11. The method of claim 4,*

*wherein a width of the opening in a first direction perpendicular to a second direction is smaller than a width of an emission region of the first pixel.*

*12. The method of claim 4, further comprising:*

*forming a first insulating layer including a plurality of first openings exposing a portion of each of the first electrode of the first pixel and second electrode of second pixel, and a second opening overlapping the opening of the opposite electrode.*

*13. The method of claim 12,*

*wherein the first insulating layer further includes an upper surface and an inclined surface adjacent to the second opening, wherein an edge portion of the opening of the second electrode overlaps the inclined surface of the first insulating layer in the plan-view.*

*14. The method of claim 13, further comprising:*

*forming a second insulation layer between the substrate and the first insulation layer, the second insulation layer comprising an open portion overlapping the opening of the opposite electrode.*

*15. The method of claim 14, further comprising:*

*wherein the first pixel further comprises at least one transistor connected to the first electrode of the first pixel, and the second insulation layer is between the transistor and the first electrode.*

*16. The method of claim 15, further comprising:*

*forming a third insulation layer between the substrate and transistor, the third insulation layer comprising an open portion overlapping the opening of the opposite electrode.*

*17. The method of claim 16, further comprising:*

*wherein the at least one transistor comprises a semiconductor layer on the third insulation layer, a gate electrode on the semiconductor layer, and a drain electrode on the gate electrode.*

*18. The method of claim 17, further comprising:*

*forming a fourth insulation layer between the semiconductor layer and the gate electrode, the fourth insulation layer comprising an open portion overlapping the opening of the opposite electrode.*

*19. The method of claim 18, further comprising:*

*forming a fifth insulation layer between the gate electrode and the drain electrode, the fifth insulation layer comprising an open portion overlapping the opposite electrode.*

*20. The method of claim 14, further comprising:*

*forming a third insulation layer on the substrate;*

*forming a fourth insulation layer on the third insulation layer; and*

*forming a fifth insulation layer on the fourth insulation layer; and*

*wherein at least one of the third insulation layer, the fourth insulation layer, and the fifth insulation layer comprises an open portion overlapping the opening of the opposite electrode.*

*21. The method of claim 20, wherein the first electrode of the first pixel is an anode, and the opposite electrode is a cathode.*

*22. The method of claim 4, further comprising:*

*forming a third pixel including a third electrode and a third organic layer on the third electrode;*

*forming a fourth pixel including a fourth electrode and a fourth organic layer on the fourth electrode; and,*

*wherein the third pixel and the fourth pixel which are adjacent to the first pixel in a first direction perpendicular to a second direction.*

* * * * *